United States Patent
Suzuki et al.

(10) Patent No.: US 9,215,802 B2
(45) Date of Patent: Dec. 15, 2015

(54) WIRING SUBSTRATE AND MULTI-PIECE WIRING SUBSTRATE

(71) Applicant: NGK SPARK PLUG CO., LTD., Nagoya, Aichi (JP)

(72) Inventors: Jyun Suzuki, Nagoya (JP); Naoki Kito, Nagoya (JP); Masami Hasegawa, Konan (JP); Chizuo Nakashima, Tajimi (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 31 days.

(21) Appl. No.: 14/234,604

(22) PCT Filed: Dec. 25, 2012

(86) PCT No.: PCT/JP2012/083446
§ 371 (c)(1),
(2) Date: Jan. 23, 2014

(87) PCT Pub. No.: WO2013/099854
PCT Pub. Date: Jul. 4, 2013

(65) Prior Publication Data
US 2014/0174803 A1 Jun. 26, 2014

(30) Foreign Application Priority Data
Dec. 27, 2011 (JP) ................................. 2011-285230

(51) Int. Cl.
*H05K 1/00* (2006.01)
*H05K 1/03* (2006.01)
(Continued)

(52) U.S. Cl.
CPC ............ *H05K 1/0306* (2013.01); *H05K 3/0052* (2013.01); *H05K 1/183* (2013.01);*H05K 3/403* (2013.01); *H05K 2201/0909* (2013.01); *H05K 2201/0919* (2013.01); *H05K 2201/09181* (2013.01); *H05K 2201/09354* (2013.01)

(58) Field of Classification Search
None
See application file for complete search history.

(56) References Cited

U.S. PATENT DOCUMENTS 5,346,751 A * 9/1994 Lau ........................ C04B 35/581
257/E23.009
6,774,748 B1 * 8/2004 Ito et al. ........................ 333/247
(Continued)

FOREIGN PATENT DOCUMENTS

| JP | 2000-068414 A | 3/2000 |
|---|---|---|
| JP | 2009-170499 A | 7/2009 |
| JP | 2011-165899 A | 8/2011 |

OTHER PUBLICATIONS

JP2000-068414 English translation.*
(Continued)

*Primary Examiner* — Steven T Sawyer
(74) *Attorney, Agent, or Firm* — Stites & Harbison, PLLC; Jeffrey A. Haeberlin; James R. Hayne

(57) ABSTRACT

A wiring substrate includes a substrate body formed of a plate-like ceramic, having a front surface, a back surface, and a height of 0.8 mm or less; a cavity opening at the front surface and having a rectangular shape as viewed in plane; and side walls having a thickness of 0.3 mm or less between a side surface of the cavity and a side surface of the substrate body. The wiring substrate further includes an electrically conductive layer having the form of a frame and formed on the front surface to surround an opening of the cavity; a ceramic surface having the form of a frame and located adjacently to the electrically conductive layer and along the outer periphery of the front surface; and a via conductor formed in the substrate body along the side surface of the cavity between a bottom surface of the cavity and the front surface.

4 Claims, 4 Drawing Sheets

(51) Int. Cl.
  *H05K 3/00* (2006.01)
  *H05K 1/18* (2006.01)
  *H05K 3/40* (2006.01)

(56) References Cited

U.S. PATENT DOCUMENTS

2004/0194993 A1* 10/2004 Aoyagi ................. H05K 1/144
  174/541
2006/0125076 A1* 6/2006 Fukagaya ............... H01L 23/04
  257/690
2008/0174006 A1* 7/2008 Fuchinoue .................... 257/704
2011/0315439 A1* 12/2011 Nakashima ................... 174/260

OTHER PUBLICATIONS

JP2011-165899 English translation.*
JP2009-170499 English translation.*
JPO, International Search Report issued in corresponding international application No. PCT/JP2012/083446, mailed Mar. 12, 2013.

* cited by examiner

WIRING SUBSTRATE AND MULTI-PIECE WIRING SUBSTRATE

TECHNICAL FIELD

The present invention relates to a wiring substrate made of ceramic (ceramic package) and reduced in overall size and the thickness of side walls surrounding a cavity and to a multi-piece-wiring substrate which has a plurality of the wiring substrates and in which it is unlikely that there will arise a problem of bridging connection between brazing materials disposed on electrically conductive layers formed on the front surfaces of the adjacent wiring substrates in joining metal frames onto the respective electrically conductive layers or a problem of defective joining of metal lids resistance-welded onto the electrically conductive layers caused by sags of plating layers covering the surfaces of the electrically conductive layers.

BACKGROUND ART

In order to reduce the overall size, a box-like wiring substrate having a cavity in which an electronic component, such as a crystal oscillator, is mounted is required to reduce the thickness of side walls surrounding the cavity. For example, there has been proposed a package which has a plurality of via conductors formed in side walls, each via conductor having an arc shape as viewed in plane and partially exposed in the form of a flat vertical surface at an inner side surface of the cavity, and in which the upper ends of the via conductors are connected to a plurality of wire bonding pads, respectively, formed on a front surface surrounding the opening of the cavity and having the form of a rectangular frame as viewed in plane and in which the lower ends of the via conductors are connected to a plurality of electrode pads, respectively, formed on the bottom surface of the cavity (refer to, for example, Patent Document 1).

However, when the side walls which encompass the front surface surrounding the cavity and having the form of a rectangular frame as viewed in plane are reduced in thickness, the following problem has arisen in some cases: in melting brazing materials disposed on the electrically conductive layers of the plurality of wiring substrates in the multi-piece-wiring substrate for brazing metal frames onto the front surfaces, respectively, the adjacent brazing materials are connected in a bridging manner.

Meanwhile, in the case where, in order to establish electrical continuity between an electrically conductive layer formed on the front surface in the form of a rectangular frame and an electrically conductive layer formed on the bottom surface of the cavity, wall-surface electrically conductive layers are formed by printing on the side walls of the cavity for connecting the two electrically conductive layers, the following problem has been potentially involved: breakage of electrical continuity caused by the occurrence of an unconnected portion, a deterioration in productivity, or difficulty in brazing the metal frame horizontally onto the electrically conductive layer formed on the frame-like front surface due to protrusion of the wall-surface electrically conductive layer to a side toward the electrically conductive layer formed on the frame-like front surface.

Furthermore, in the case where the electrically conductive layer is formed across the overall width of the frame-like front surface, a portion of an Ni or Au plating layer covering the surface of the electrically conductive layer runs off the front surface and down to the outer surface of the side wall or to the inner side surface of the cavity; i.e., a so-called plating sag arises; therefore, in joining a metal lid onto the electrically conductive layer by resistance welding, electrical resistance is apt to change according to the amount of the sag. Accordingly, in some cases, an electronic component mounted in the cavity has failed to operate properly due to a defective seal between the plating layer covering the electrically conductive layer and a plating layer covering the surface of the metal lid caused by defective welding.

PRIOR ART DOCUMENT

Patent Document

Patent Document 1: Japanese Patent Application Laid-Open (kokai) No. 2009-170499 (pages 1 to 11, FIGS. 1 to 7).

SUMMARY OF THE INVENTION

Problem to be Solved by the Invention

An object of the present invention is to solve the problem described in the section TECHNICAL FIELD and to provide a wiring substrate made of ceramic and reduced in overall size and the thickness of side walls surrounding a cavity, as well as a multi-piece-wiring substrate which has a plurality of the wiring substrates and in which it is unlikely that there will arise a problem of bridging connection between brazing materials disposed on electrically conductive layers formed on the front surfaces of the adjacent wiring substrates in joining metal frames onto the respective electrically conductive layers or a problem of defective joining of metal lids resistance-welded onto the electrically conductive layers caused by plating sags of plating layers covering the surfaces of the electrically conductive layers.

Means for Solving the Problem and Effects of the Invention

In order to solve the above problem, the present invention has been conceived according to the following idea: an electrically conductive layer is formed on a rectangular-frame-like front surface, surrounding an opening of a cavity, of a substrate body having a predetermined size or less and is positionally biased toward the cavity, and a via conductor whose one end is connected to the electrically conductive layer is disposed in the substrate body such that a portion of the via conductor is exposed at a side surface of the cavity.

Specifically, a first wiring substrate according to the present invention (claim 1) comprises a substrate body formed of a plate-like ceramic, having a front surface and a back surface, and having a height between the front surface and the back surface of 0.8 mm or less; a cavity opening at the front surface of the substrate body; and side walls having a thickness of 0.3 mm or less between a side surface of the cavity and a side surface (an outer side surface) of the substrate body. The wiring substrate is characterized by further comprising an electrically conductive layer having the form of a frame as viewed in plane and formed on the front surface of the substrate body in such a manner as to surround an opening of the cavity; a ceramic surface having the form of a frame as viewed in plane and located adjacently to the electrically conductive layer and along an outer periphery of the front surface of the substrate body; and a via conductor formed in the substrate body along the side surface of the cavity between a bottom surface of the cavity and the front surface such that a portion thereof is exposed at the side surface of the cavity and such that one end thereof is connected to the electrically conductive layer.

According to the thus-configured wiring substrate, the via conductor whose one end is connected to the electrically conductive layer and whose portion is exposed at a side surface of the cavity is reduced in the thickness of its cross section as viewed in plane as compared with a via conductor having a circular cross section, which will be described later; thus, the side walls which surround the cavity and in which the via conductor is disposed are reduced in thickness to 0.3 mm or less, and the wiring substrate is reduced in size such that the height between the front surface and the back surface of the substrate body is reduced to 0.8 mm or less.

Also, on the front surface, having the form of a rectangular frame as viewed in plane, of the substrate body, the frame-like ceramic surface is located along the outer periphery of the electrically conductive layer formed on the front surface; thus, in a state of a multi-piece-wiring substrate, which will be described later, for yielding a plurality of the wiring substrates, there can be reliably prevented a problem of bridging connection between brazing materials disposed on the electrically conductive layers formed on the front surfaces of the adjacent wiring substrates in melting the brazing materials for brazing metal frames (rings) onto the respective electrically conductive layers. As a result, by means of joining metal lids or the like onto the metal frames, the cavities of the wiring substrates can be reliably sealed.

Furthermore, since the ceramic surface having the form of a frame as viewed in plane is located adjacently to the frame-like electrically conductive layer formed on the front surface of the substrate body, and along the outer periphery of the front surface, plating sags mentioned above are unlikely to be generated. As a result, in joining the metal lid onto the electrically conductive layer by resistance welding, electrical resistance is stabilized, and a plating layer on the electrically conductive layer and a plating layer covering the surface of the metal lid can thereby be joined properly; therefore, sealing performance is improved, so that normal operation can be ensured for an electronic component mounted in the cavity.

Furthermore, a second wiring substrate according to the present invention (claim 2) comprises a substrate body formed of a plate-like ceramic, having a front surface and a back surface, and having a height between the front surface and the back surface of 0.8 mm or less; a cavity opening at the front surface of the substrate body; and side walls having a thickness of 0.3 mm or less between a side surface of the cavity and a side surface of the substrate body. The wiring substrate is characterized by further comprising an electrically conductive layer having the form of a frame as viewed in plane and formed on the front surface of the substrate body in such a manner as to surround an opening of the cavity; a ceramic surface having the form of a frame as viewed in plane and located adjacently to the electrically conductive layer and along an outer periphery of the front surface of the substrate body; and an inner-side-surface electrical conductor formed on the side surface of the cavity between a bottom surface of the cavity and the front surface and connected, at one end thereof, to the electrically conductive layer.

According to the thus-configured wiring substrate, the inner-side-surface electrical conductor formed on the side surface of the cavity and connected, at one end thereof, to the electrically conductive layer is thin; thus, the wiring substrate is reduced in size such that the side walls which surround the cavity and which have the inner-side-surface conductor disposed on an inner side are reduced in thickness to 0.3 mm or less and such that the height between the front surface and the back surface thereof is 0.8 mm or less. Also, similar to the first wiring substrate, the frame-like ceramic surface is located along the outer periphery of the electrically conductive layer formed on the front surface; thus, in a state of a multi-piece-wiring substrate, there can be reliably prevented a problem of bridging connection between brazing materials disposed on the electrically conductive layers formed on the front surfaces of the adjacent wiring substrates in melting the brazing materials for brazing metal frames onto the respective electrically conductive layers. As a result, by means of joining metal lids or the like onto the metal frames, the cavities of the wiring substrates can be reliably sealed. Furthermore, since the ceramic surface having the form of a frame as viewed in plane is located adjacently to the frame-like electrically conductive layer formed on the front surface of the substrate body, and along the outer periphery of the front surface, plating sags mentioned above are unlikely to be generated; thus, in joining the metal lid onto the electrically conductive layer by resistance welding, electrical resistance is stabilized, and a plating layer on the electrically conductive layer and a plating layer covering the surface of the metal lid can thereby be joined properly; therefore, sealing performance is improved, so that normal operation can be ensured for an electronic component mounted in the cavity.

The ceramic mentioned above encompasses high-temperature-fired ceramics, such as alumina, and low-temperature-fired ceramics, such as glass-ceramic.

Also, the substrate body is a laminate of a plurality of ceramic layers formed as follows: two or more green sheets are laminated and compressed together, and the resultant laminate is fired.

Furthermore, the substrate body may have, in addition to the cavity opening at its front surface and having a rectangular shape as viewed in plane, another cavity opening symmetrically to the above-mentioned cavity at the back surface thereof. In other words, the form of the cavity encompasses a form in which the cavity opens only at the front surface or the back surface of the substrate body and a form in which the cavity opens at both of the front surface and the back surface of the substrate body. The shape of the cavity as viewed in plane is not limited to rectangle (square or rectangle).

Also, in the substrate body, the height between the front surface and the back surface is 0.8 mm or less, and the thickness of the side walls encompassing the front surface is 0.3 mm or less, thereby reducing the size of the wiring substrate encompassing the substrate body and exposing a portion of the via conductor at the side surface of the cavity through employment of a side wall thickness of 0.3 mm or less.

Furthermore, at least one piece of the via conductor is formed per wiring substrate.

Also, a pair of electrodes is formed on the bottom surface of the cavity for mounting an electronic component, such as a crystal oscillator, a SAW filter, a transistor, an inductor, a semiconductor device, or a capacitor, or a light-emitting device such as a light-emitting diode.

Additionally, the electrically conductive layer is coated, on its surface, with an Ni plating film, and a frame-shaped metal member is joined onto the Ni plating film via an Ag brazing material and an Au plating film. Alternatively, the electrically conductive layer is coated, on its surface, with an Ni plating film and an Au plating film, and a metal lid is joined onto the Au plating film for closing (sealing) the cavity.

Also, the present invention can encompass the first wiring substrate in which the via conductor has a cross-sectional shape of semicircle, arc, elongated semicircle, or semiellipse and has a cross-sectional area which is 50% to 90% the cross-sectional area of a base circle, a base elongated circle, or a base ellipse.

In this case, since the via conductor has a cross-sectional shape of semicircle, arc, elongated semicircle, or semiellipse and has a cross-sectional area which is 50% to 90% the cross-sectional area of a base circle, a base elongated circle, or a base ellipse, the side walls of the substrate body which surround the cavity and in which the via conductor is disposed can be reliably reduced in thickness, so that reducing the entire size of the wiring substrate (package) is further facilitated.

When the cross-sectional area of the via conductor is less than 50% the cross-sectional area of a base circle, a base elongated circle, or a base ellipse, electrical resistance during energization begins to markedly increase. When the cross-sectional area of the via conductor is in excess of 90% the above cross-sectional area, difficulty is encountered in reducing the thickness of the side walls surrounding the cavity. Therefore, these ranges are eliminated.

Also, the via conductor having the above-mentioned cross-sectional shape can be formed as follows: a via hole having a circular cross section and formed in a green sheet is filled with an electrically conductive paste which contains a W powder, an Mo powder, etc., thereby forming beforehand a green via conductor having a circular cross section; subsequently, there is punched out an inner region which has a rectangular shape as viewed in plane, corresponds to the cavity, and includes a vertical plane intersecting with a cross section of the via conductor and extending along a radial direction of the via conductor or extending at a position between the radial direction and a relevant tangential direction in parallel with these directions.

Furthermore, the inner-side-surface conductor in the second wiring substrate may be formed on a corner portion between the two adjacent side surfaces of the cavity instead of being formed on one side surface at its intermediate position.

A multi-piece-wiring substrate according to the present invention (claim 3) is characterized by comprising a product region having a plurality of the wiring substrates which are adjacently arranged in matrix form; an edge portion formed of the same ceramic as that used to form the wiring substrate, having the form of a rectangular frame as viewed in plane, and located around the product region; and dividing grooves formed along boundaries between the ceramic surfaces of the adjacent wiring substrates, the ceramic surfaces being adjacently located on a side toward the front surfaces of the wiring substrates, and dividing grooves formed along boundaries between the edge portion and the ceramic surfaces of the wiring substrates located outermost in the product region as viewed in plane, the boundaries being located on the side toward the front surface of the multi-piece-wiring substrate.

According to the thus-configured multi-piece-wiring substrate, the substrate bodies of the wiring substrates can be reduced in thickness of the front surfaces (side walls); the wiring substrates and the entire product region can be reduced in size; and there can be reliably prevented a problem of bridging connection between brazing materials disposed on the electrically conductive layers formed on the front surfaces of the adjacent wiring substrates in melting the brazing materials. As a result, by means of joining metal lids or the like onto the metal frames via the brazing materials, the cavities of the adjacent wiring substrates can be reliably sealed.

The multi-piece-wiring substrate may have, in addition to the cavities opening at the front surfaces of the substrate bodies of the wiring substrates, cavities opening symmetrically to the above-mentioned cavities at the back surfaces of the substrate bodies.

The dividing grooves can be formed not only by a grooving process in which a cutting edge is applied to a green sheet laminate but also by repeated laser machining.

Furthermore, each of the ceramic surfaces located along the outer peripheries of the front surfaces of the adjacent wiring substrates located on opposite sides of the dividing groove has a width of about 10 µm when the dividing groove has a width of about 30 µm.

MODES FOR CARRYING OUT THE INVENTION

Embodiment of the present invention will next be described.

Figure 1:
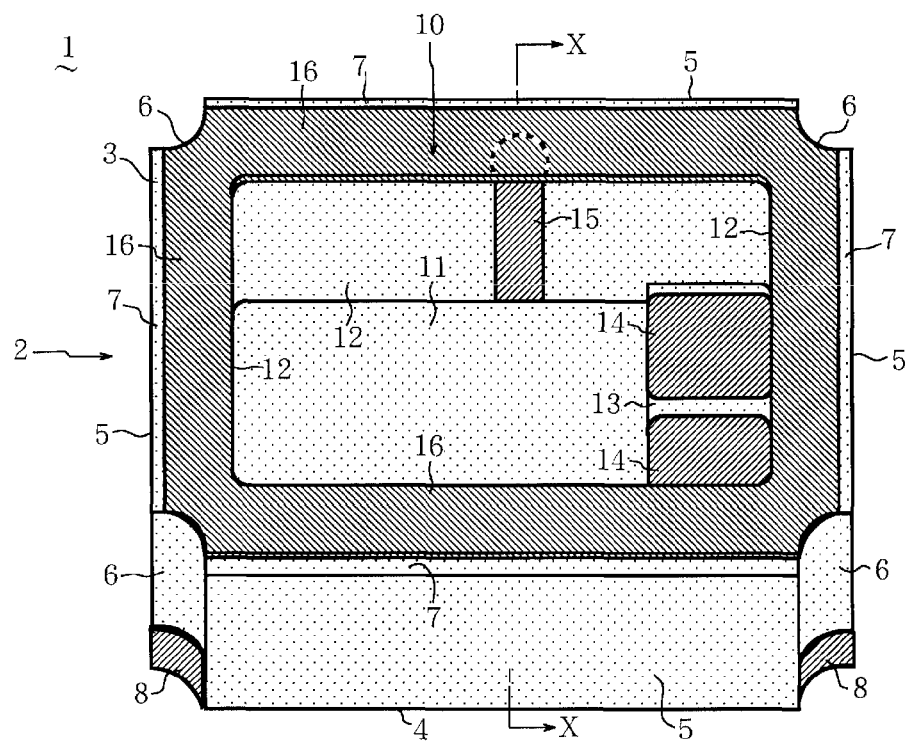
[FIG. 1] Downward perspective view showing a first wiring substrate according to the present invention.
Figure 2:
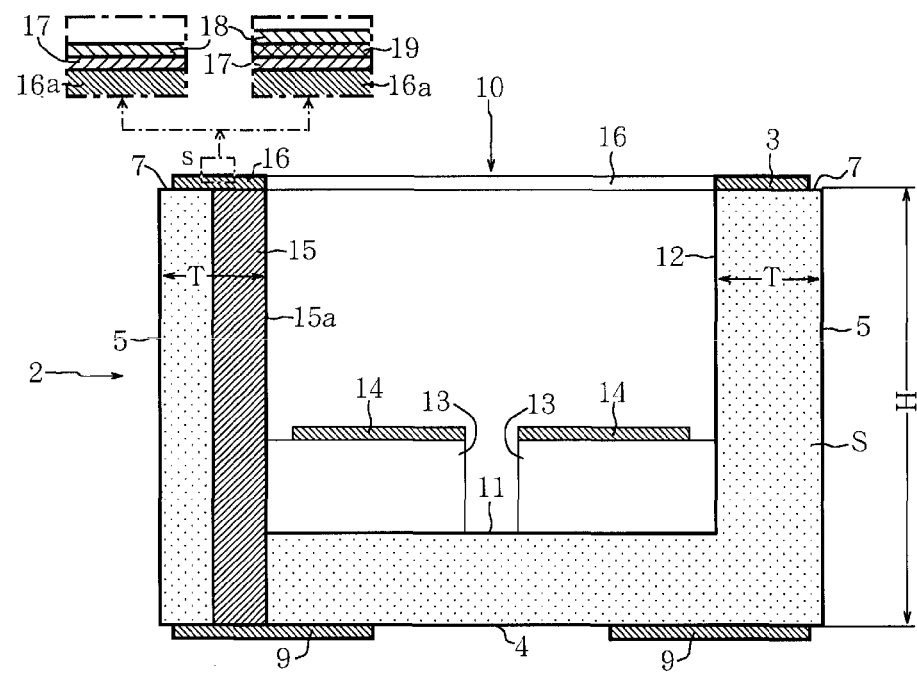
[FIG. 2] Vertical sectional view taken along line X-X and viewed along the arrows in FIG. 1.

FIG. 1 is a perspective view showing a first wiring substrate (package) 1 according to the present invention. FIG. 2 is a vertical sectional view taken along line X-X and viewed along the arrows in FIG. 1.

As shown in FIGS. 1 and 2, the wiring substrate 1 includes a plate-like substrate body 2 having a front surface 3 and a back surface 4; a cavity 10 opening at the front surface 3 of the substrate body 2; and four side walls 5 surrounding the cavity 10.

The substrate body 2, for example, has a plate-like shape and is formed of ceramic S such as alumina, and includes the back surface 4 having a rectangular shape as viewed in plane; the front surface 3 which has the form of a rectangular frame as viewed in plane and surrounds a cavity 10 having the same outline as that of the back surface 4 as viewed in plane and having a rectangular shape substantially analogous to the above-mentioned rectangular shape; and the four side walls 5 surrounding the cavity 10.

In the substrate body 2, a height (H: thickness) between the front surface 3 and the back surface 4 is 0.8 mm or less, and the thickness (T) of the four side walls 5 between a (outer) side surface of the substrate body 2 and a side surface 12 of the cavity 10 is 0.3 mm or less.

Also, the cavity 10 has a bottom surface 11 having a rectangular shape as viewed in plane; the rectangular side surfaces 12 standing from four respective sides of the bottom surface 11; and a pair of pedestals 13 formed of the ceramic S and provided in a standing condition on a side toward the right short side in FIG. 1. Two electrodes 14 formed of W or Mo are disposed on the respective pedestals 13 for connection to respective connection terminals (not shown) of an electronic component, such as a crystal vibrator, to be mounted later.

As shown in FIGS. 1 and 2, an electrically conductive layer 16 having the form of a rectangular frame as viewed in plane is formed on the front surface 3 having the form of a rectangular frame as viewed in plane along the four inner peripheral sides of the front surface 3 located toward the opening of the cavity 10. A ceramic surface 7 having the form of a frame as viewed in plane is located on the front surface 3 along the four outer peripheral sides excluding corner portions of the front surface 3, adjacently to the electrically conductive layer 16.

The electrically conductive layer 16 assumes either one of the following two forms: a form in which, as shown in the left-hand enlarged fragmentary view represented by the dot-dash line in FIG. 2, the electrically conductive layer 16 includes a metallization layer 16a formed of W or Mo, and an Ni plating film 17 and an Au plating film 18, which are sequentially formed on the surface of the metallization layer 16, and a metal lid (not shown) coated with an Ni plating film is resistance-welded onto the surface of the Au plating film 18, and a form in which, as shown in the right-hand enlarged fragmentary view represented by the dot-dash line in FIG. 2, the electrically conductive layer 16 includes the metallization layer 16a mentioned above, and the Ni plating film 17 and a brazing material layer 19, which are sequentially formed on the surface of the metallization layer 16a, and an unillustrated metal frame (ring) is brazed onto the brazing material layer 19. The brazing material layer 19 is formed of, for example, an Ag—Cu alloy or an Au—Sn alloy.

Also, as shown in FIG. 1, a concave arc surface 6 which is substantially a quarter circle as viewed in plane is located at each corner of the substrate body 2 between the adjacent side walls 5, and a concave electrically conductive layer 8 is formed at a lower portion of each of the arc surfaces 6. The concave electrically conductive layers 8 are connected to respective back-surface electrically conductive layers 9 which are external connection terminals of the wiring substrate 1 and are formed on the back surface 4 at near four corners, and the concave electrically conductive layers 8 partially constitute a circuit for establishing electrical communication between the back-surface electrically conductive layers 9 and the electrodes 14. The circuit includes an unillustrated conductor extending horizontally through the side walls 5. The concave electrically conductors 8 and the back-surface electrically conductive layers 9 are also formed of, for example, W or Mo.

Furthermore, as shown in FIGS. 1 and 2, a via conductor 15 is formed in one of the four side walls 5 which has a long side as viewed in plane, at an intermediate position of the side wall 5 such that the upper end (one end) thereof is connected to the electrically conductive layer 16 and such that the lower end (the other end) is connected to one of the back-surface electrically conductive layers 9. The via conductor 15 is also formed of, for example, W or Mo; has a cross-sectional shape of a semicircle or an arc shape greater than a semicircle as viewed in plane; and exposes its flat vertical surface (its portion) 15a at the side surface 12 of the cavity 10. The via conductor 15 serves as a passage of plating current in coating the metallization layer 16a with the Ni plating film 17 or the Au plating film 18 by electroplating; and partially constitutes a grounding circuit for connecting an internal wiring including the pair of electrodes 14 to the metallization layer 16a.

A portion of the via conductor 15 extending between the bottom surface 11 of the cavity 10 and the back surface 4 of the substrate body 2 may assume a different form having a circular cross section and not having the vertical surface 15a.

According to the wiring substrate 1 described above, since the via conductor 15 whose upper end is connected to the electrically conductive layer 16 and whose portion 15a is exposed at the side surface 12 of the cavity 10 is reduced in the thickness of its cross section as viewed in plane as compared with a via conductor having a circular cross section, the side wall 5 of the substrate body 2 in which the via conductor 15 is disposed can be reduced in thickness; accordingly, the entire wiring substrate 1 can also be reduced in size.

Furthermore, on the front surface 3 of the substrate body 2, the frame-like ceramic surface 7 is located along the outer periphery of the electrically conductive layer 16 formed on the front surface 3; thus, in a state of a multi-piece-wiring substrate for yielding a plurality of the wiring substrates 1, there can be reliably prevented a problem of defective dividing into the individual wiring substrates 1 or an electrical short circuit caused by bridging connection between the brazing materials 19 disposed on the electrically conductive layers 16 formed on the front surfaces 3 of the adjacent wiring substrates 1 in melting the brazing materials 19 for brazing metal frames onto the respective electrically conductive layers 16. Also, by virtue of provision of the ceramic surface 7, there is restrained the generation of plating sags of the plating films 17 and 18 formed on the surface of the electrically conductive layer 16, whereby a metal lid can be reliably resistance-welded onto the electrically conductive layer 16.

Therefore, by means of welding the metal lids onto the respective metal frames or welding the metal lids directly onto the respective electrically conductive layers 16, the cavities 10 of the wiring substrates 1 can be reliably sealed.

The wiring substrate 1 may assumes the following form: the cavity mentioned above also opens at the back surface 4 of the substrate body 2; the electrically conductive layer 16 mentioned above is also formed on the back surface 4; and the via conductor mentioned above is disposed in the wiring substrate 1 such that a portion thereof is exposed at a side surface of the cavity located toward the back surface 4.

Also, in the form in which the wiring substrate 1 also has the cavity on the side toward the back surface 4, two or more via conductors 15 may be provided for connecting the electrically conductive layer 16 and the back-surface electrically conductive layers 9.

Figure 3:
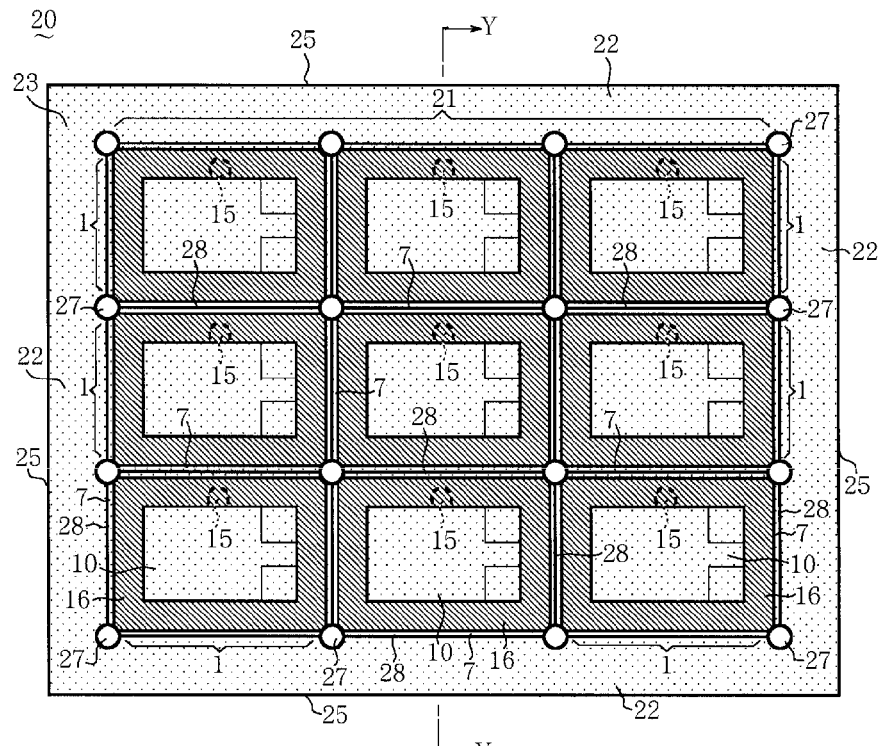
[FIG. 3] Plan view showing a first multi-piece-wiring substrate which contains the above wiring substrates.
Figure 4:
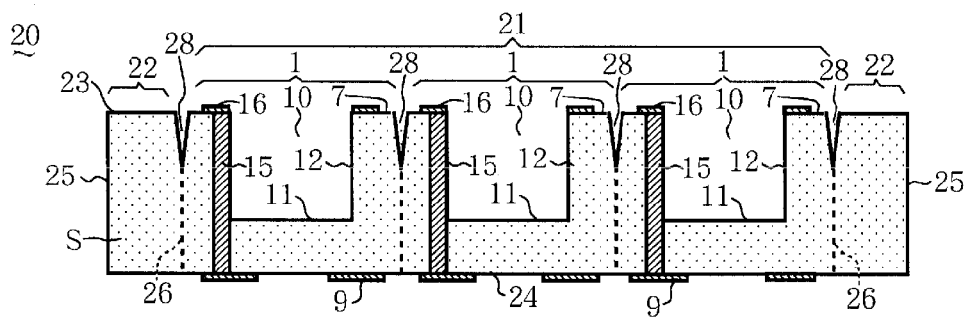
[FIG. 4] Vertical sectional view taken along line Y-Y and viewed along the arrows in FIG. 3.

FIG. 3 is a plan view showing a multi-piece-wiring substrate 20 for yielding a plurality of the wiring substrates 1. FIG. 4 is a vertical sectional view taken along line Y-Y and viewed along the arrows in FIG. 3.

As shown in FIG. 3, the multi-piece-wiring substrate 20 has a front surface 23 having a rectangular shape as viewed in plane, a back surface 24, and four side surfaces 25. The multi-piece-wiring substrate 20 includes a product region 21 having a plurality of the wiring substrates 1 which are adjacently arranged in matrix form; an edge portion 22 formed of the same ceramic S as that mentioned above, having the form of a rectangular frame as viewed in plane, and located around the product region 21; and dividing grooves 28 formed in lattice as viewed in plane and along boundaries between the adjacent wiring substrates 1 within the product region 21 and along boundaries between the edge portion 22 and the wiring substrates 1 located outermost in the product region 21.

As shown in FIG. 4, the boundaries between the wiring substrates 1 and the boundaries between the edge portion 22 and the wiring substrates 1 located outermost are prospective dicing planes 26 represented by the broken lines in the drawing. The dividing grooves 28 having a substantially V-shaped cross section are formed in lattice as viewed in plane along the front surface 23 where upper end portions of the prospective dicing planes 26 are exposed.

As shown in FIG. 3, the dividing grooves 28 located along the boundaries between the adjacent wiring substrates 1 within the product region 21 are sandwiched between the belt-like ceramic surfaces 7 exposed on a side toward the outer peripheries of the front surfaces 3 of the wiring substrates 1 and located on the opposite sides of the dividing grooves 28. The multi-piece-wiring substrate 20 has through-holes 27 having a circular cross section, extending therethrough between the front surface 23 and the back surface 24, and formed at positions where, as viewed in plane, the dividing grooves 28 and a pair of the ceramic surfaces 7 between which the dividing grooves 28 are sandwiched cross at right angles. An unillustrated electrically conductive layer having a cylindrical shape is formed on the wall of each of the through-holes 27 near the back surface 24. The thus-formed conductive layer will be later divided into the four arc-shaped concave electrically conductive layers 8.

Furthermore, as shown in FIGS. 3 and 4, in each of the plurality of wiring substrates 1 located within the product region 21, the electrically conductive layer 16 and the ceramic surface 7 are formed on the front surface 3; the upper end of the via conductor 15 whose portion is exposed at the side surface 12 of the cavity 10 is connected to the electrically conductive layer 16; and the lower end of the via conductor 15 is connected to one of the back-surface electrically conductive layers 9 on the back surface 24.

Figure 5:
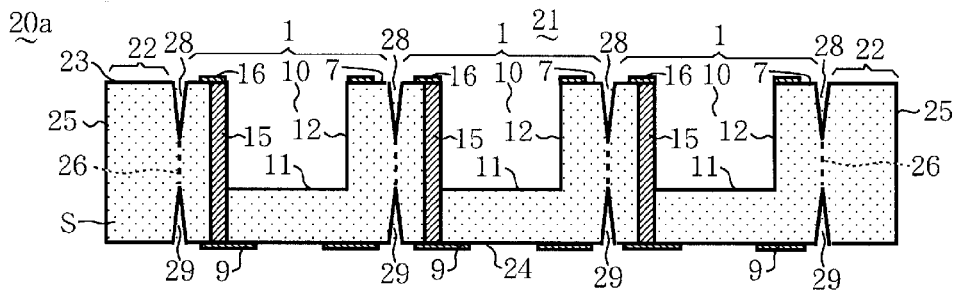
[FIG. 5] Vertical sectional view similar to FIG. 4, showing an applied form of the first multi-piece-wiring substrate.

Additionally, as shown in FIG. 5, dividing grooves 29 similar to the dividing grooves 28 may be further formed on the back surface 24 symmetrically to the dividing grooves 28, thereby yielding a multi-piece-wiring substrate 20a.

The multi-piece-wiring substrates 20 and 20a may assume a form in which each of the wiring substrates 1 further has a cavity opening at the back surface 24 symmetrically to the cavity 10 as well as the electrically conductive layer 16 and the ceramic surface 7 formed on the back surface 24.

The following method was employed for yielding the multi-piece-wiring substrates 20 and 20a. For example, a plurality of green sheets which contained alumina as a main component were prepared; via holes or through-holes were punched through the green sheets; the relatively small-diameter via holes were filled with an electrically conductive paste which contained a W powder, etc.; and an electrically conductive paste mentioned above was cylindrically applied onto the inner wall surfaces of the relatively large-diameter through holes.

Next, the electrically conductive paste mentioned above was applied by printing onto the entire upper surface of the green sheet which was to become the top ceramic layer, except for a peripheral portion which was to become the edge portion 22; subsequently, a plurality of portions which were to become the cavities 10 were punched out. Also, the electrically conductive paste mentioned above was applied by printing onto portions, which were to become the back-surface electrically conductive layers 9, of the lower surface of the green sheet which was to become the bottom ceramic layer. Furthermore, a plurality of portions which intersected the plurality of via conductors along a radial direction of the via conductors and which were to become the cavities 10 having a rectangular shape as viewed in plane were punched out from a single or a plurality of green sheets, which was or were to become an intermediate ceramic layer or intermediate ceramic layers.

Next, the plurality of green sheets which were to become the top, intermediate, and bottom layers were laminated and compressed together, thereby yielding a large-sized green sheet laminate. The front surface 23 of the green sheet laminate was irradiated with a laser beam a plurality of times along the prospective dicing planes 26 so as to form the dividing grooves 28, along the prospective dicing planes 26, in the electrically conductive paste applied to the entire front surface; at this time, portions of the applied electrically conductive paste located on opposite sides of the dividing grooves 28 were preferentially removed, thereby forming the metallization layers 16a of the wiring substrates 1 on the front surface 23. In the above-mentioned laminating and compressing process, electrical connection was established among the metallization layers 16a, the green via conductors 15, the back-surface electrically conductive layers 9, and the electrodes 14 formed on the respective pedestals 13 within the cavities 10.

After the green sheet laminate was fired in a predetermined temperature range, the fired laminate was sequentially immersed in an electro-Ni plating bath and an electro-Au plating bath, thereby sequentially forming the Ni plating film 17 and the Au plating film 18 and forming the metallization layer 16a into the electrically conductive layer 16.

In the case of disposition of the brazing material 19, Ni plating was performed on the metallization layer 16a; the brazing material 19 was disposed on the formed Ni plating film 17; and after the brazing material 19 was melted and solidified through heating and cooling at predetermined temperatures, Au plating 18 was formed on the surface of the Ni plating film 17 and the surface of the brazing material 19. Thus, the electrically conductive layers 16 are formed.

The Ni plating film and the Au plating film were also sequentially formed on externally exposed electrically conductive portions in addition to the electrically conductive layers 16; specifically, on the back-surface electrically conductive layers 9, the electrodes 14, and the vertical surfaces 15a, which are portions of the via conductors 15.

By the method mentioned above, the multi-piece-wiring substrate 20 was able to be yielded.

By means of irradiating the back surface 24 of the green sheet laminate mentioned above with a laser beam along the prospective dicing planes 26, there was able to be yielded the multi-piece-wiring substrate 20a having also the dividing grooves 29 on the back surface 24.

Finally, the multi-piece-wiring substrate 20 was subjected to a shearing process along the dividing grooves 28, thereby yielding a plurality of the individual wiring substrates 1. Also, by means of dividing the multi-piece-wiring substrate 20a along the dividing grooves 28 and 29, a plurality of the wiring substrates 1 was able to be yielded.

According to the multi-piece-wiring substrates 20 and 20a, the substrate bodies 2 of the wiring substrates 1 were able to be reduced in thickness of the side walls 5 encompassing the front surfaces 3; the wiring substrates 1 and the entire product region 21 were able to be reduced in size; and there was able to be reliably prevented a problem of bridging connection between the brazing materials 19 disposed on the front surfaces 3 of the adjacent wiring substrates 1 in melting the brazing materials 19. As a result, there was able to be reliably prevented a problem of defective dividing into the individual wiring substrates 1, an electrical short circuit, etc. Furthermore, by virtue of provision of the ceramic surfaces 7 along the outer peripheries of the front surfaces 3 of the wiring substrates 1, there was restrained the generation of plating sags of the plating films 17 and 18 formed on the surfaces of the electrically conductive layers 16, whereby metal lids were able to be reliably resistance-welded onto the respective electrically conductive layers 16 at a fixed electrical resistance.

Therefore, by means of joining the metal lids by resistance welding or the like onto the respective metal frames brazed, via the brazing materials 19 or directly, onto the respective electrically conductive layers 16, the cavities 10 of the adjacent wiring substrates 1 were able to be reliably sealed.

Figure 6:
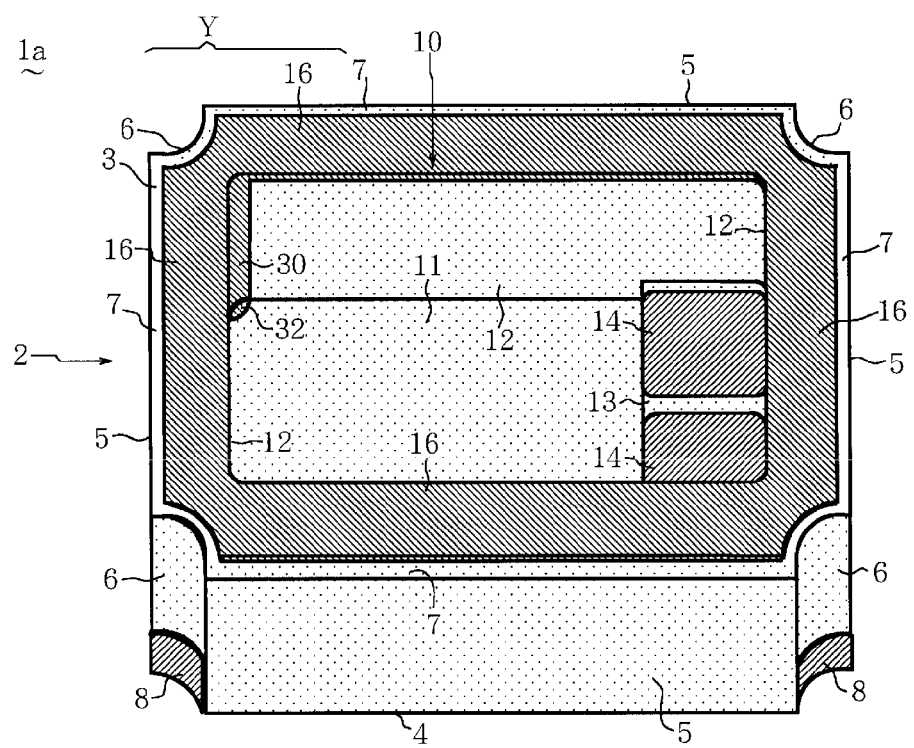
[FIG. 6] Downward perspective view showing a second wiring substrate according to the present invention.
Figure 7:
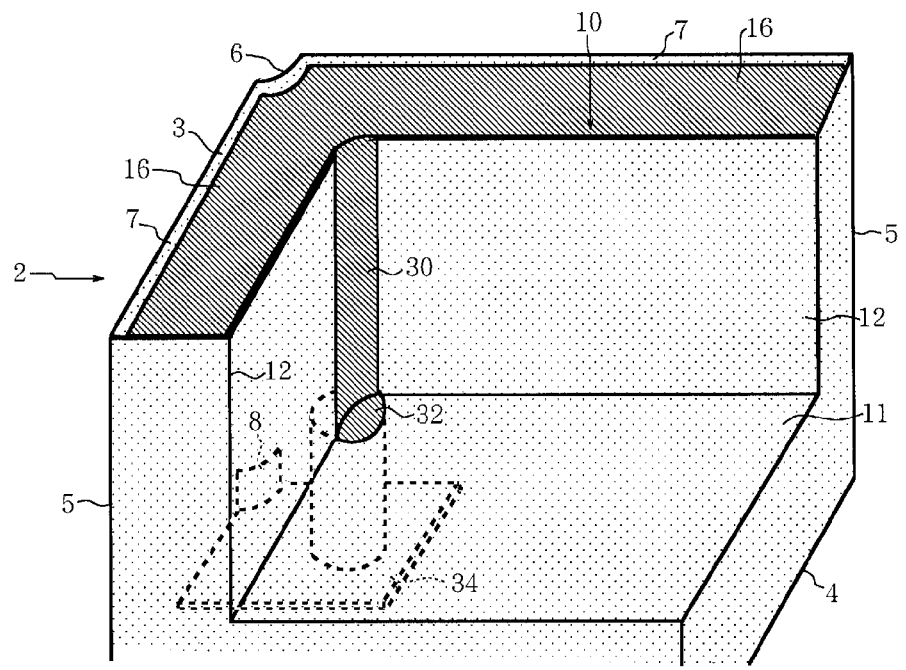
[FIG. 7] Downward perspective view showing, partially in a see-through manner, a corner portion Y in FIG. 6.

FIG. 6 is a perspective view showing a second wiring substrate (package) 1a according to the present invention. FIG. 7 is a perspective view showing, partially in a see-through manner, a Y portion in FIG. 6 and viewed from a different angle.

As shown in FIGS. 6 and 7, the wiring substrate 1a includes the plate-like substrate body 2 mentioned above having the front surface 3 and the back surface 4; the cavity 10 opening at the front surface 3 of the substrate body 2; and the four side walls 5 surrounding the cavity 10. The pedestals 13 and the electrodes 14 mentioned above are located on the bottom surface 11 of the cavity 10.

In the substrate body 2 also, the height (H: thickness) between the front surface 3 and the back surface 4 is 0.8 mm or less, and the thickness (T) of the four side walls 5 between a (outer) side surface of the substrate body 2 and a side surface 12 of the cavity 10 is 0.3 mm or less.

Also, the electrically conductive layer 16 mentioned above is formed on the front surface 3 of the substrate body 2 having the form of a rectangular frame as viewed in plane along the four inner peripheral sides of the front surface 3 located toward the opening of the cavity 10. The ceramic surface 7 having the form of a frame as viewed in plane is located on the front surface 3 of the substrate body 2 along the four outer peripheral sides including corner portions of the front surface 3, adjacently to the electrically conductive layer 16.

Furthermore, as shown in FIGS. 6 and 7, the arc surface 6 mentioned above is located at each corner of the substrate body 2 between the adjacent side walls 5, and the concave electrically conductive layer 8 mentioned above is formed at a lower portion of each of the arc surfaces 6. The concave electrically conductive layers 8 are connected to respective back-surface electrically conductive layers 34 which are external connection terminals of the wiring substrate 1a and are formed on the back surface 4 at near four corners, and the concave electrically conductive layers 8 partially constitute a circuit for establishing electrical connection between some back-surface electrically conductive layers 34 and the electrodes 14. The circuit includes an unillustrated conductor extending horizontally through the side walls 5.

Additionally, an inner-side-surface electrical conductor 30 whose upper end (one end) is connected to the electrically conductive layer 16 is formed an inner corner portion between the side walls 5 which are of the four component side walls 5 of the substrate body 2 and have a long side and a short side, respectively, as viewed in plane. The inner-side-surface electrical conductor 30 has a thin arc shape such that a cross section thereof is substantially a quarter circle as viewed in plane; is connected, at its lower end (the other end), to a via conductor 32 which extends through the substrate body 2 between the bottom surface 11 of the cavity 10 and the back surface 4 of the substrate body 2 and has a circular cross section; and can electrically communicate with the back-surface electrically conductive layer 34 via the via conductor 32.

The inner-side-surface conductor 30 and the via conductor 32 are also formed of W, Mo, or the like mentioned above. As will be described later, the inner-side-surface conductor 30 is formed as follows: the electrically conductive paste mentioned above is applied, by negative-pressure-utilized drip printing, onto side surfaces near a single corner portion of a through-hole which is punched through an upper green sheet and is to become the cavity 10.

According to the wiring substrate 1a described above, since the inner-side-surface electrical conductor 30 whose upper end is connected to the electrically conductive layer 16 and whose cross-sectional shape is a thin arc is formed along a corner portion between the side surfaces 12 of the cavity 10, the side walls 5 of the substrate body 2 which have the inner-side-surface electrical conductor 30 disposed on their inner side can be reduced in thickness; accordingly, the entire size of the wiring substrate 1a is reduced.

Also, the frame-like ceramic surface 7 is located along the entire outer periphery of the electrically conductive layer 16 formed on the front surface 3 of the substrate body 2; thus, in a state of a multi-piece-wiring substrate for yielding a plurality of the wiring substrates 1a, there can be reliably prevented a problem of defective dividing into the individual wiring substrates 1a or an electrical short circuit caused by bridging connection between the brazing materials 19 disposed on the electrically conductive layers 16 formed on the front surfaces 3 of the adjacent wiring substrates 1a in melting the brazing materials 19 for brazing metal frames onto the respective electrically conductive layers 16. Also, by virtue of provision of the ceramic surface 7, there is restrained the generation of plating sags of the plating films 17 and 18 formed on the surface of the electrically conductive layer 16, whereby a metal lid can be reliably resistance-welded onto the electrically conductive layer 16. Therefore, by means of welding the metal lids onto the respective metal frames or welding the metal lids directly onto the respective electrically conductive layers 16, the cavities 10 of the wiring substrates 1a can be reliably sealed.

The inner-side-surface electrical conductor 30 may be formed on a single side surface 12 of the cavity 10 at a horizontally intermediate position. Also, the wiring substrate 1a may assumes the following form: the cavity mentioned above also opens at the back surface 4 of the substrate body 2; the electrically conductive layer 16 mentioned above is also formed on the back surface 4; and the inner-side-surface conductor mentioned above is also formed and exposed at a corner portion between the side surfaces of the cavity on the side toward the back surface 4. Furthermore, in the form in which the wiring substrate 1a also has the cavity on the side toward the back surface 4, two or more inner-side-surface conductors 30 may be provided for connecting the electrically conductive layer 16 and the back-surface electrically conductive layers 34.

Figure 8:
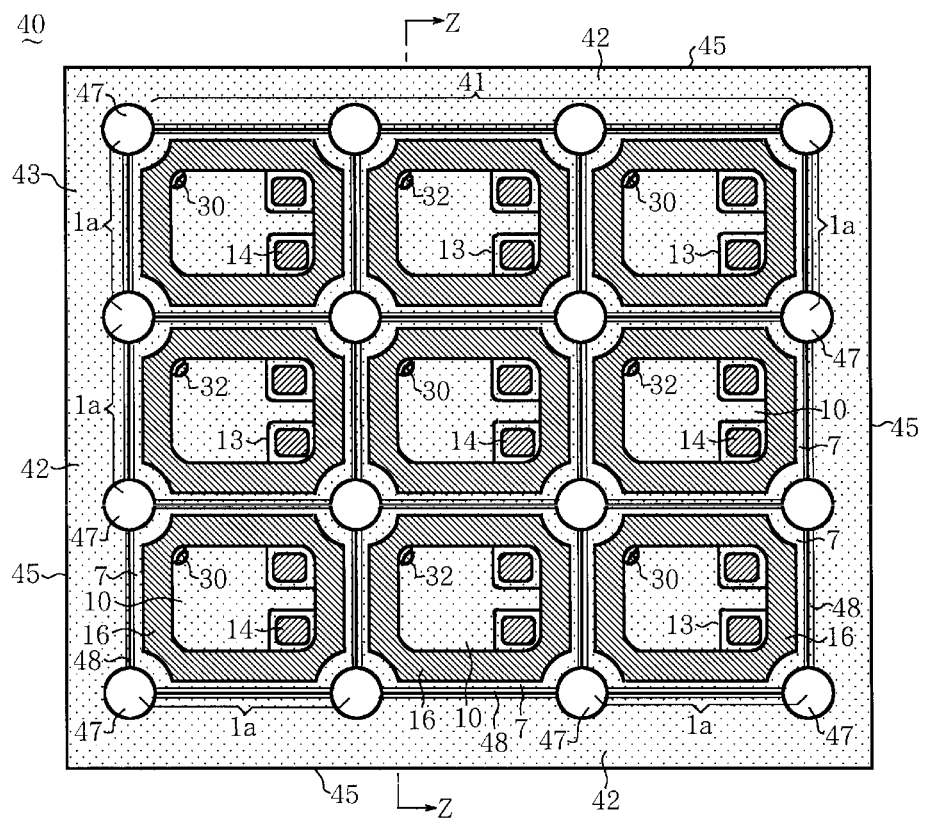
[FIG. 8] Plan view showing a second multi-piece-wiring substrate which contains the above wiring substrates.
Figure 9:
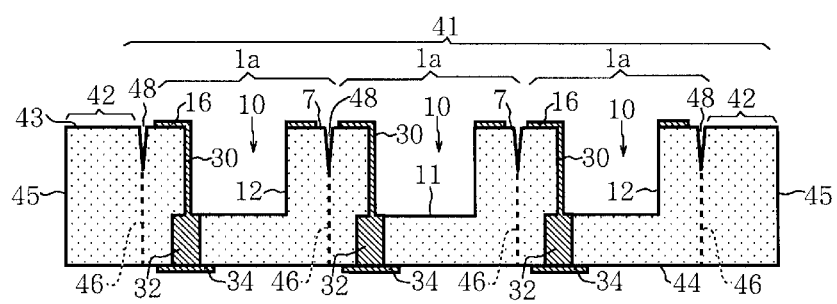
[FIG. 9] Vertical sectional view taken along line Z-Z and viewed along the arrows in FIG. 8.

FIG. 8 is a plan view showing a multi-piece-wiring substrate 40 for yielding a plurality of the wiring substrates 1a. FIG. 9 is a vertical sectional view taken along line Z-Z and viewed along the arrows in FIG. 8.

The multi-piece-wiring substrate 40 is formed of the ceramic S mentioned above and includes, as shown in FIG. 8, a product region 41 having a plurality of the wiring substrates 1a which are adjacently arranged in matrix form as viewed in plane; an edge portion 42 having the form of a rectangular frame as viewed in plane and located around the product region 41; and dividing grooves 48 formed in lattice as viewed in plane and along boundaries between the adjacent wiring substrates 1a within the product region 41 and along boundaries between the edge portion 42 and the wiring substrates 1a located outermost in the product region 41.

As shown in FIG. 9, the boundaries between the wiring substrates 1a and the boundaries between the edge portion 42 and the wiring substrates 1a located outermost are prospective dicing planes 46 represented by the broken lines in the drawing. The dividing grooves 48 having a substantially V-shaped cross section are formed in lattice as viewed in plane along a front surface 43 where upper end portions of the prospective dicing planes 46 intersect with one another. Dividing grooves may also be formed on the back surface 44 where lower end portions of the prospective dicing planes 46 intersect with one another, such that the dividing grooves on the upper side become symmetric with those on the lower side.

Also, as shown in FIG. 8, the dividing grooves 48 located along the boundaries between the adjacent wiring substrates 1*a* within the product region 41 are sandwiched between the belt-like ceramic surfaces 7 exposed on a side toward the outer peripheries of the front surfaces 3 of the wiring substrates 1*a* and located on the opposite sides of the dividing grooves 48. The multi-piece-wiring substrate 40 has through-holes 47 having a circular cross section, extending therethrough between the front surface 43 and the back surface 44, and formed at positions where, as viewed in plane, the dividing grooves 48 and a pair of the ceramic surfaces 7 between which the dividing grooves 48 are sandwiched cross at right angles. An unillustrated electrically conductive layer having a cylindrical shape is formed on the wall of each of the through-holes 47 near the back surface 44. The thus-formed conductive layer will be later divided into the four arc-shaped concave electrically conductive layers 8.

Furthermore, as shown in FIGS. 8 and 9, in each of the plurality of wiring substrates 1*a* located within the product region 41, the electrically conductive layer 16 and the ceramic surface 7 are formed along the entire periphery of the front surface 3; an upper end portion of the inner-side-surface conductor 30 exposed at the side surface 12 of the cavity 10 is connected to the electrically conductive layer 16; and a lower end portion of the inner-side-surface conductor 30 is connected to the via conductor 32 whose upper end surface is exposed at the bottom surface 11 of the cavity 10, and can electrically connect, via the via conductor 32, with one of the back-surface electrically conductive layers 34 located on the back surface 44.

The following method was employed for yielding the multi-piece-wiring substrate 40.

A plurality of the green sheets mentioned above were prepared; via holes and through-holes 47 were punched through the green sheets at predetermined positions; and the formed via holes were filled with the electrically conductive paste mentioned above, or the electrically conductive paste was applied onto the inner circumferential surfaces of the via holes.

Next, the electrically conductive paste mentioned above was applied by printing onto the entire upper surface of the green sheet which was to become the top ceramic layer, except for a peripheral portion which was to become the edge portion 42; subsequently, through-holes which were to become the cavities were punched through the green sheet. Also, through-holes were formed, by punching mentioned above, in the green sheet which was to become an intermediate ceramic layer and which contained the prospective pedestals 13 in the cavities 10. Also, an electrically conductive paste mentioned above was applied by printing onto portions, which were to become the back-surface electrically conductive layers 34, of the lower surface of the green sheet which was to become the bottom ceramic layer.

Figure 10:
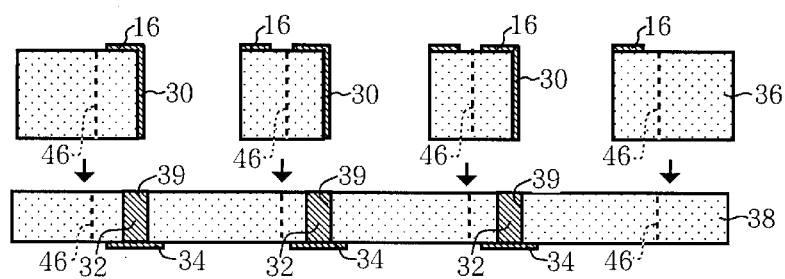
[FIG. 10] Schematic view showing a manufacturing step of the second multi-piece-wiring substrate.

Next, the two green sheets which were to become the top ceramic layer and the intermediate ceramic layer were laminated together such that the through-holes of one green sheet communicate with the respective ones of the other green sheet, thereby yielding an upper green sheet laminate 36 shown in FIG. 10. Also, in a state in which negative pressure was applied in the thickness direction of the green sheet laminate 36, the electrically conductive paste mentioned above was applied onto a single corner portion of each of the through-holes of the green sheet laminate 36 by printing in a negative-pressure air flow; i.e., by so-called drip printing.

As a result, as shown in FIG. 10, a green inner-side-surface conductor 30 was formed at the corner portion of each of the through-holes of the green sheet laminate 36. In a lower green sheet 38 shown in FIG. 10, via holes 39 were filled with a green via conductor 32, and green back-surface electrically conductive layers 34 were connected to the respective via conductors 32 at a side toward the back surface.

Furthermore, as represented by the arrows in FIG. 10, the upper green sheet laminate 36 and the lower green sheet 38 were laminated and compressed together, thereby yielding a large-sized green sheet laminate. The front surface 43 of the green sheet laminate was irradiated with a laser beam a plurality of times along the prospective dicing planes 46 so as to form the dividing grooves 48, along the prospective dicing planes 46, in the electrically conductive paste applied to the entire front surface; at this time, portions of the applied electrically conductive paste located on opposite sides of the dividing grooves 48 were preferentially removed, thereby forming the metallization layers 16*a* of the wiring substrates 1*a* on the front surface 43.

In the above-mentioned laminating and compressing process, electrical connection was established among the green metallization layers 16*a*, the inner-side-surface conductors 30, the via conductors 32, the back-surface electrically conductive layers 34, and the electrodes 14 formed on the respective pedestals 13 within the cavities 10.

After the green sheet laminate was fired in a predetermined temperature range, the fired laminate was sequentially immersed in an electro-Ni plating bath and an electro-Au plating bath, thereby sequentially forming the Ni plating film 17 and the Au plating film 18 on the metallization layer 16*a* and thus forming the electrically conductive layer 16.

In the case of disposition of the brazing material 19, Ni plating was performed on the metallization layer 16*a*; the brazing material 19 was disposed on the formed Ni plating film 17; and after the brazing material 19 was melted and solidified through heating and cooling at predetermined temperatures, Au plating 18 was formed on the surface of the Ni plating film 17 and the surface of the brazing material 19.

The Ni plating film and the Au plating film were also sequentially formed on externally exposed electrically conductive portions in addition to the electrically conductive layers 16; specifically, on the back-surface electrically conductive layers 34, the electrodes 14, the inner-side-surface conductors 30, and the surfaces (exposed surfaces) of the via conductors 32.

By the method mentioned above, the multi-piece-wiring substrate 40 was able to be yielded.

By means of irradiating the back surface 44 of the green sheet laminate mentioned above with a laser beam along the prospective dicing planes 46, there was able to be yielded the multi-piece-wiring substrate having the dividing grooves also on the back surface 44 in a symmetrical manner between the upper and lower sides.

Finally, the multi-piece-wiring substrate 40 was subjected to a shearing process along the dividing grooves 48, thereby yielding a plurality of the individual wiring substrates 1*a*.

According to the multi-piece-wiring substrate 40, the substrate bodies 2 of the wiring substrates 1*a* were able to be reduced in thickness of the side walls 5 encompassing the front surfaces 3; the wiring substrate 1*a* and the entire product region 41 were able to be reduced in size; and there was able to be reliably prevented a problem of bridging connection between the brazing materials 19 disposed on the front surfaces 3 of the adjacent wiring substrates 1*a* in melting the brazing materials 19. As a result, there was able to be reliably prevented a problem of defective dividing into the individual wiring substrates 1a, an electrical short circuit, etc. Furthermore, by virtue of provision of the ceramic surfaces 7 along the outer peripheries of the front surfaces 3 of the wiring substrates 1a, there was restrained the generation of plating sags of the plating films 17 and 18 formed on the surfaces of the electrically conductive layers 16, whereby metal lids were able to be reliably resistance-welded onto the respective electrically conductive layers 16 at a fixed electrical resistance. Therefore, by means of joining the metal lids onto the respective metal frames brazed via the brazing materials 19 or directly onto the respective electrically conductive layers 16 by resistance welding or the like, the cavities 10 of the adjacent wiring substrates 1a were able to be reliably sealed.

The present invention is not limited to the embodiments described above.

For example, the substrate body 2 and the edge portion 22 may be of high-temperature-fired ceramics other than alumina, such as mullite and aluminum nitride, or of low-temperature-fired ceramics, such as glass-ceramic. In the case of employment of low-temperature-fired ceramics, for example, Ag or Cu is used to form conductors, such as the via conductor 15 and the electrically conductive layer 16.

Also, there may be eliminated the concave arc surfaces 6 and the concave electrically conductive layers 8 disposed at the corners of the wiring substrates 1 and 1a; accordingly, the through-holes 27 may be eliminated from the multi-piece-wiring substrates 20 and 40.

Furthermore, the ceramic surface 7 may be in such a form as to be exposed also at four corner portions adjacent to the arc surfaces 6 on the front surface 3 of the wiring substrate 1. The multi-piece-wiring substrate 20 may be such that the wiring substrates 1 have the ceramic surfaces 7 in such a form on the front surfaces 3.

Also, in addition to a metal lid of 42Alloy or Kovar, a ceramic lid may be brazed onto the brazing material layer 19 disposed on the top layer of the electrically conductive layer 16 of the wiring substrate 1 or 1a so as to seal an electronic component mounted within the cavity 10.

Additionally, the wiring substrate may have a square shape as viewed in plane; also, the front and back surfaces of the multi-piece-wiring substrate and the product region of the multi-piece-wiring substrate may have a square shape as viewed in plane.

INDUSTRIAL APPLICABILITY

The present invention can reliably provide a wiring substrate made of ceramic and reduced in size and the thickness of side walls surrounding a cavity, as well as a multi-piece-wiring substrate which has a plurality of the wiring substrates and in which it is unlikely that there will arise, for example, a problem of bridging connection between brazing materials disposed on electrically conductive layers formed on the front surfaces of the adjacent wiring substrates in joining metal frames onto the respective electrically conductive layers.

DESCRIPTION OF REFERENCE NUMERALS 1, 1a: wiring substrate
2: substrate body
3, 23, 43: front surface
4, 24, 44: back surface
7: ceramic surface
10: cavity
11: bottom surface of cavity
12: side surface of cavity
15: via conductor
15a: portion of via conductor
16: electrically conductive layer
20, 20a, 40: multi-piece-wiring substrate
21, 41: product region
22, 42: edge portion
26, 46: prospective dicing plane (boundary)
28, 29, 48: dividing groove
30: inner-side-surface electrically conductive layer
S: ceramic
H: height
T: thickness

The invention claimed is:

1. A wiring substrate comprising:
a substrate body formed of a plate-like ceramic, having a front surface and a back surface, and having a height between the front surface and the back surface of 0.8 mm or less;
a cavity opening at the front surface of the substrate body; and
side walls having a thickness of 0.3 mm or less between a side surface of the cavity and a side surface of the substrate body;
the wiring substrate being characterized by further comprising:
an electrically conductive layer having the form of a frame as viewed in plane and formed on the front surface of the substrate body in such a manner as to surround an opening of the cavity for receiving a frame-shaped member or a metal lid to be joined onto the electrically conductive layer;
a ceramic surface having the form of a frame as viewed in plane and located adjacently to the electrically conductive layer and along an outer periphery of the front surface of the substrate body; and
a via conductor formed in the substrate body along the side surface of the cavity between a bottom surface of the cavity and the front surface such that a portion thereof is exposed at the side surface of the cavity and such that one end thereof is connected to the electrically conductive layer.

2. A wiring substrate comprising:
a substrate body formed of a plate-like ceramic, having a front surface and a back surface, and having a height between the front surface and the back surface of 0.8 mm or less;
a cavity opening at the front surface of the substrate body; and
side walls having a thickness of 0.3 mm or less between a side surface of the cavity and a side surface of the substrate body;
the wiring substrate being characterized by further comprising:
an electrically conductive layer having the form of a frame as viewed in plane and formed on the front surface of the substrate body in such a manner as to surround an opening of the cavity for receiving a frame-shaped member or a metal lid to be joined onto the electrically conductive layer;
a ceramic surface having the form of a frame as viewed in plane and located adjacently to the electrically conductive layer and along an outer periphery of the front surface of the substrate body; and
an inner-side-surface electrical conductor formed on the side surface of the cavity between a bottom surface of the cavity and the front surface and connected, at one end thereof, to the electrically conductive layer.

3. A multi-piece-wiring substrate characterized by comprising:
a product region having a plurality of the wiring substrates according to claim 1 adjacently arranged in matrix form;
an edge portion formed of the same ceramic as that used to form the wiring substrate, having the form of a rectangular frame as viewed in plane, and located around the product region; and
dividing grooves formed along boundaries between the ceramic surfaces of the adjacent wiring substrates, the ceramic surfaces being adjacently located on a side toward the front surfaces of the wiring substrates, and dividing grooves formed along boundaries between the edge portion and the ceramic surfaces of the wiring substrates located outermost in the product region as viewed in plane, the boundaries being located on the side toward the front surface of the multi-piece-wiring substrate.

4. A multi-piece-wiring substrate characterized by comprising:
a product region having a plurality of the wiring substrates according to claim 2 adjacently arranged in matrix form;
an edge portion formed of the same ceramic as that used to form the wiring substrate, having the form of a rectangular frame as viewed in plane, and located around the product region; and
dividing grooves formed along boundaries between the ceramic surfaces of the adjacent wiring substrates, the ceramic surfaces being adjacently located on a side toward the front surfaces of the wiring substrates, and dividing grooves formed along boundaries between the edge portion and the ceramic surfaces of the wiring substrates located outermost in the product region as viewed in plane, the boundaries being located on the side toward the front surface of the multi-piece-wiring substrate.

* * * * *